United States Patent [19]

Meignant

[11] 4,429,452
[45] Feb. 7, 1984

[54] METHOD OF MANUFACTURING FIELD-EFFECT TRANSISTORS WITH SELF-ALIGNED GRID AND TRANSISTORS THUS OBTAINED

[75] Inventor: Didier Meignant, Emerainville, France

[73] Assignee: U.S. Philips Corporation, New York, N.Y.

[21] Appl. No.: 327,374

[22] Filed: Dec. 4, 1981

[30] Foreign Application Priority Data

Dec. 24, 1980 [FR] France ............................ 80 27423

[51] Int. Cl.³ .................... H01L 21/28; H01L 21/308
[52] U.S. Cl. ........................................ 29/571; 29/578; 156/656
[58] Field of Search ........................ 29/571, 579, 578; 357/15, 22; 156/653, 656; 427/84

[56] References Cited

U.S. PATENT DOCUMENTS

| | | | |
|---|---|---|---|
| 3,675,313 | 7/1972 | Driver | 29/571 |
| 3,678,573 | 7/1972 | Driver | 29/571 |
| 3,737,701 | 6/1973 | Hoeberechts | 313/66 |
| 3,764,865 | 10/1973 | Napoli | 29/578 |
| 3,866,310 | 2/1975 | Driver | 29/571 |
| 3,898,353 | 8/1975 | Napoli | 29/571 |
| 3,920,861 | 11/1975 | Dean | 357/22 |
| 4,048,712 | 9/1977 | Buiatti | 29/571 |
| 4,063,992 | 12/1977 | Hosack | 29/580 |
| 4,075,652 | 2/1978 | Umebachi | 29/571 |
| 4,145,459 | 3/1979 | Goel | 29/571 |
| 4,261,095 | 4/1981 | Dreves | 357/15 |
| 4,266,333 | 5/1981 | Reichert | 29/571 |
| 4,318,759 | 3/1982 | Trenary | 156/661.1 |

FOREIGN PATENT DOCUMENTS 2029641 3/1980 United Kingdom ............ 357/22 E

Primary Examiner—L. Dewayne Rutledge
Assistant Examiner—J. J. Zimmerman
Attorney, Agent, or Firm—Paul R. Miller

[57] ABSTRACT

The invention relates to a method of manufacturing field-effect transistors having a self-aligned grid in the submicron range without using a mask of submicron size. The invention is remarkable in that it consists of undercutting the drain electrode at an edge covered with a lacquer over a distance typically smaller than one micron, depositing the source electrode, etching the semiconductor material between the drain electrode and source electrode at the undercut area, and depositing the grid electrode in the cavity thus formed. The invention also relates to field-effect transistors thus obtained.

17 Claims, 7 Drawing Figures

METHOD OF MANUFACTURING FIELD-EFFECT TRANSISTORS WITH SELF-ALIGNED GRID AND TRANSISTORS THUS OBTAINED

The invention relates to a method of manufacturing field-effect transistors, more particularly with self-aligned grid. The invention also relates to FET's (field-effect transistors) thus obtained. Very generally the invention resides in the field of electronic industry, more specifically the elaboration of semiconductor devices.

It is known from the prior art to realize field-effect transistors with self-aligned grid and in this connection for memory one of the first patents filed in the United States of America is cited on the technique of self-alignment, filed Mar. 10, 1970, having the title: "Self-aligned gate field-effect transistor, and method of preparing", by Driver et al, which patent was granted under U.S. Pat. No. 3,678,573.

These methods have notably permitted the manufacture of transistors with grids in the micron range starting from the adaption of a common technology such as photo-etching.

However, while on the one hand the reduction of the length of the grid found its natural limit in the minimum dimension of the mask apertures used and the effects of diffraction due to the wavelength of the radiation used (the minimum dimension is now approximately 0.3 micron), on the other hand, with the usual methods of forming source and drain electrodes of a FET transistor, for example of an alloy gold-germanium (Au-Ge≃80/20) so as to obtain an ohmic contact with the covered semiconductor layer, excessively doped microzones are formed in the alloy such that the current density in the electrode is not uniform and such that the breakdown voltage is appreciably less high.

It is the object of the invention to mitigate the prior inconveniences so as to realize FET transistors of which the electric characteristics are improved, while in addition it permits realization of FET transistors having a self-aligned grid in the submicron range without being necessary to use a submicron mask.

The method of manufacturing according to the present invention is characterized in that:

(a) a first metal layer of a metal forming a rectifying contact with a semiconductor material is deposited on the semiconductor material;

(b) the first metal layer is covered with a photosensitive lacquer;

(c) the lacquer is exposed to a sensitizing radiation through a mask which exposes a zone defining the drain electrode;

(d) the non-sensitized lacquer is dissolved with an appropriate solution;

(e) underetching of the first metal layer is carried out over a distance typically smaller than a micron;

(f) a second metal layer is deposited, aligned on the edge of the previously underetched lacquer, and is of a metal or metal alloy forming an ohmic contact with the semiconductor material so as to realize the source electrode;

(g) the sensitized lacquer is removed with a suitable solution;

(h) the semiconductor material is etched in the uncovered zone bounded by the first and second metal layers in the form of a cavity; and (i) a third metal layer of a metal forming a rectifying contact with the semiconductor material is deposited in the cavity so as to self-align the grid electrode to the upper edges of the cavity.

According to an embodiment of the invention, in the case of a semiconductor material of gallium arsenide, a layer of a tungsten-titanium alloy deposited, for example, by sputtering is chosen as a first metal layer forming a rectifying contact.

From the following description with reference to the accompanying drawings, given by way of example, it will be better understood how the invention can be realized.

a first method, called additive, developed around 1964;

a second method, called subtractive, developed round 1970.

According to the additive method, as described and protected by French Pat. No. 1,437,781, filed Apr. 21, 1965, claiming priority of the Netherlands of Apr. 21, 1964 in the name of the Company N. V. PHILIPS' GLOEILAMPENFABRIEKEN, the method of manufacturing consists in that a first metal layer is deposited and is then covered with a masking material which is resistant to etching, in the form of a thin ribbon, the metal layer is then removed at the unmasked areas and is underetched along the mask, after which the second metal layer is applied taking advantage of the shadow effect of the mask material, so as to obtain the two source and drain electrodes aligned on the edges of the mask, after which the mask is removed.

This method is called additive because the semiconductor material is not submitted to etching while the electrode configurations are deposited on the material in an additive manner.

According to the subtractive method, as described and protected by the patent deposited in the United States of America on Mar. 10, 1970, and granted under U.S. Pat. No. 3,678,573 in the name of the assigned Company WESTINGHOUSE ELECTRIC Corp., the method consists in depositing a first metal layer, covering same with a masking material which does not cover a thin ribbon of the metal layer, etching the metal layer not covered, and etching the semiconductor material in the form of a cavity, then depositing a second metal layer at least in the cavity in the form of a thin ribbon of which the edges are in alignment with the edges of the metal layers bounding the cavity, and finally removing the mask.

This method is called subtractive because the semiconductor material is etched in the form of a cavity while at least one electrode (in this case the grid electrode) is deposited in the cavity.

However, these two methods have a common disadvantage, namely the necessity of a mask having an aperture of the order of a micron or even smaller.

The realization of the mask having an aperture in the micron or submicron range proves to be difficult and expensive and more so as the aperture is made smaller.

The method according to the invention again uses certain elementary steps known in the art, but according to a different arrangement which produces a certain technical effect, notably in that it permits of avoiding the realization of a submicron mask.

Figure 1:
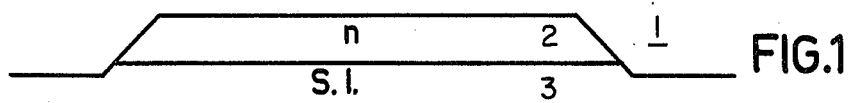
FIGS. 1 to 6 are sectional views of the various stages of the method of manufacturing a FET transistor according to the present invention.

The semiconductor material 1 as shown in FIG. 1 is in the form of a plate 2 or "mesa" obtained by photo-etching of a semiconductor layer, for example of the n-conductivity type, with a doping of the order of $10^{17}$ atoms/cm$^3$ deposited, for example, by gaseous phase epitaxy, or a molecular beam, on a substrate 3 in this case semi-insulating, obtained, for example, by doping a semiconductor material of gallium arsenide with chromium.

Figure 2:
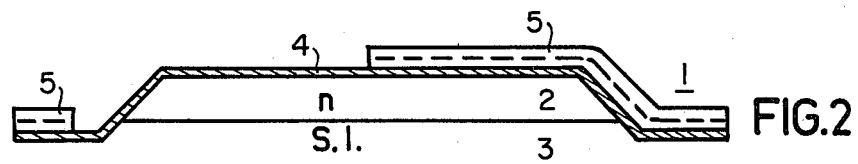

According to the present invention the method of manufacturing the field-effect transistor consists, in a first step (FIG. 2), of depositing on the semiconductor plate 2 a first metal layer 4 of a metal forming a rectifying contact with the semiconductor material. The thickness of the layer 4 which is comparatively thin is, for example, of the order of 2000 Å.

In the case of a semiconductor material of gallium arsenide chosen for its remarkly intrinsic electric qualities, the metal layer 4 may be advantageously realized of an alloy of tungsten-titanium (W/Ti=90/10) or of aluminum.

On the metal layer 4 is then deposited a layer of photosensitive lacquer 5 which is then exposed to ultraviolet radiation through a mask which does not cover a region defining the drain electrode. The thus exposed and sensitized lacquer becomes insoluble, that is to say that is can withstand the attack by an acid. The nonexposed lacquer is then eliminated by a diluted basic solution (for example a solution of diluted soda).

Figure 3:
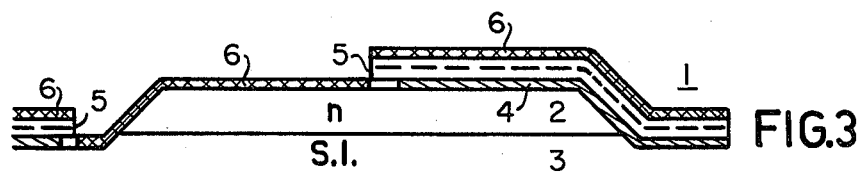

The metal layer 4 is then etched (FIG. 3) at the areas not covered by the lacquer, by a plasma (Cf$_4$+O$_2$) in the case of the tungsten-titanium alloy, or by a suitable etching solution, such as orthophosphoric acid in the case of an aluminum layer. The attack is continued until undercutting of approximately 0.3 μm of the metal layer 4 appears under the protective lacquer 5. A second metal layer 6 of a metal of alloy forming an ohmic contact with the covered semiconductor material is then deposited by evaporation. For example, in the case of a semiconductor material of gallium arsenide (GaAs), a gold-germanium alloy e.g. (Au-Ge=80/20) is very suitable for the ohmic contact. The metal layer 6 is in fact separated in two distinct portions, a first contact portion with the semiconductor material, in the region destined for the source electrode and having an edge aligned at the edge of the layer of lacquer previously undercut, and a second portion deposited on the remaining lacquer.

Figure 4:
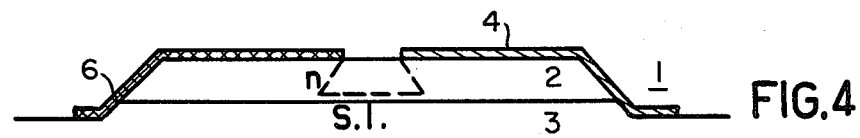

The remaining lacquer sensitized to ultraviolet radiation is then removed (FIG. 4) by means of a suitable solvent. In the case of a positive lacquer of the type "Shipley"(for example the lacquer referenced AZ 1370) a suitable solvent is acetone. With the removal of the sensitized lacquer, the metal layer 6 which covers it is also removed by lift off.

The semiconductor layer is then etched, in the zone not covered and bounded by the first and second metal layers 4 and 6, through a mask of supplementary photosensitive lacquer separated by an interstice of constant length (approximately 0.5 μm) over a width which may reach a hundred microns.

Figure 5:
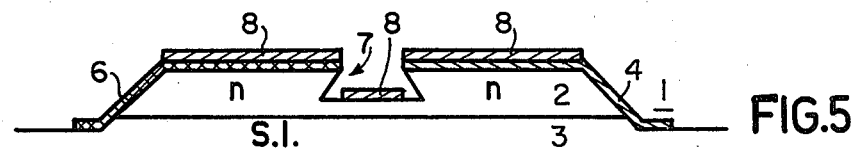

In the case of the choice of gallium arsenide as a semiconductor material, a suitable etching solution may be, for example, citric acid, and in this manner a cavity 7 having a flared bottom is obtained as is shown in FIG. 5. Other etching solutions may give rise to a different form of the aperture 7.

Finally, a third metal layer 8 is deposited, for example by evaporation, in the cavity (FIG. 5) of a metal forming a rectifying contact with the semiconductor material 1 in such manner that a thin ribbon is formed in the cavity 7 the edges of which are in alignment with the edges of the first and second metal layers 4 and 6, due to the fact that the deposit of a body by evaporation is always effected substantially in a straight line between the evaporation zone and the deposition zone.

Such a metal 8 is chosen among the metals forming a rectifying contact with the semiconductor material 1 and in the case of the choice or gallium arsenide as a semiconductor material there are mentioned, without this list being limitative, as metals or alloys aluminium, titanium-tungsten followed by a layer of gold (Ti/W=90/10) or even successive layers, prefereably titanium, platinum, gold, but also chromium, platinum, gold.

Other suitable metals could easily be chosen by those skilled in the art without departing from the scope of this invention and in this connection may be cited the work by Sze entitled "Physics of semiconductor devices" New York, John Wiley (1969) which treats of this choice.

Figure 6:
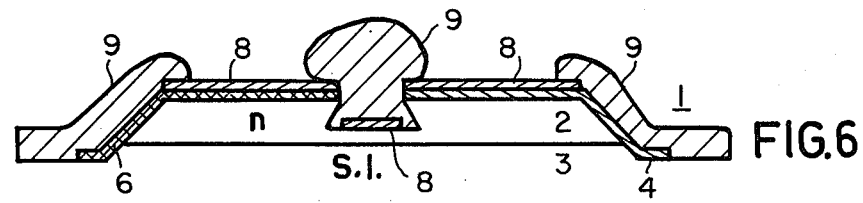

Protection coatings may also be added and hence FIG. 6 is a sectional view of the finished device covered with silica glass 9 which may be deposited, for example, by sputtering, evaporation or decomposition of silane (CVD).

Figure 7:
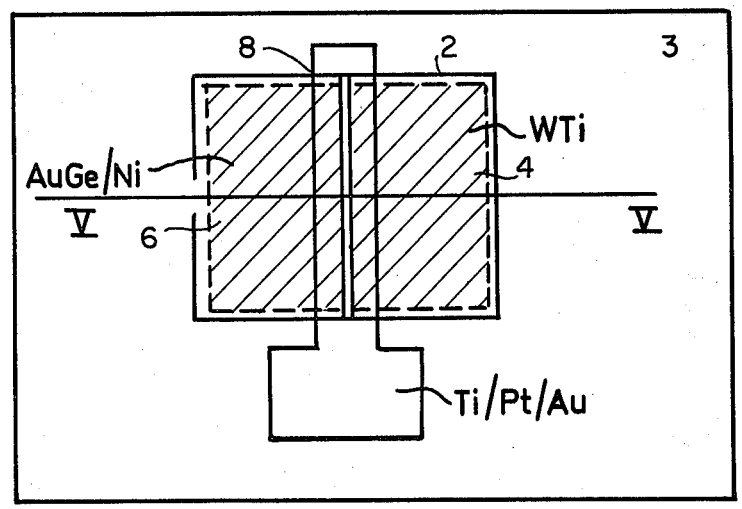
FIG. 7 is a plan view of the same FET transistor. The methods of manufacturing FET transistors according to the prior art by photo etching follow from two different methods.

FIG. 7 is a plan view of the same finished device in which identical elements are referred to by the same reference numeral while the axis V—V represents the axis along which the preceding FIG. 5 is taken.

It will be obvious that many variations are possible to those skilled in the art without departing from the scope of this invention, for example, as defined by the attached claims hereinafter, as well as for the choice of the semiconductor material or the various deposited metal layers.

What is claimed is:

1. A method of manufacturing field-effect transistors having a self-aligned grid in the submicron range comprising the steps of
   depositing a first metal layer on semiconductor material, said first metal layer forming a rectifying contact with said semiconductor material,
   covering said first metal layer with a photosensitive lacquer,
   exposing said lacquer to sensitizing radiation through a mask, said mask exposing a zone to said radiation for defining a drain electrode,
   dissolving lacquer not sensitized to said radiation by an appropriate solution,
   underetching said first metal layer below said sensitized lacquer over a dimension smaller than one micron to form an opening to said semiconductor material,
   depositing a second metal layer on said semiconductor material aligned at the edge of said opening in said underetched first metal layer, said second metal layer forming an ohmic contact with said semiconductor material to form a source electrode,
   removing said sensitized lacquer with a suitable solution, etching said semiconductor material in the form of a cavity at said opening between said first metal layer and said second metal layer, and depositing a third metal layer in said cavity, said third metal layer forming a rectifying contact with said semiconductor material, and said third metal layer forming a grid electrode self-aligned to edges of said cavity.

2. A method according to claim 1, wherein said semiconductor material is gallium arsenide.

3. A method according to claim 2, wherein said first metal layer is a tungsten-titanium alloy.

4. A method according to claim 3, wherein said second metal layer is a gold-germanium alloy.

5. A method according to claim 4, wherein said third metal layer is formed of titanium, platinum, and gold deposited in order.

6. A method according to claim 2, wherein said second metal layer is a gold-germanium alloy.

7. A method according to claim 6, wherein said third metal layer is formed of titanium, platinum, and gold deposited in order.

8. A method according to claim 2, wherein said third metal layer is formed of titanium, platinum, and gold deposited in order.

9. A method according to claim 1, wherein said first metal layer is a tungsten-titanium alloy.

10. A method according to claim 9, wherein said second metal layer is a gold-germanium alloy.

11. A method according to claim 10, wherein said third metal layer is formed of titanium, platinum, and gold deposited in order.

12. A method according to claim 9, wherein said third metal layer is formed of titanium, platinum, and gold deposited in order.

13. A method according to claim 1, wherein said second metal layer is a gold-germanium alloy.

14. A method according to claim 13, wherein said third metal layer is formed of titanium, platinum, and gold deposited in order.

15. A method according to claim 1, wherein said third metal layer is formed of titanium, platinum, and gold deposited in order.

16. A method according to claim 1, wherein said semiconductor material is a mesa semiconductor layer formed on a semi-insulating substrate layer.

17. A method according to claim 1, wherein said semiconductor material is a semiconductor plate.

* * * * *